(12) United States Patent
Luo et al.

(10) Patent No.: US 8,779,796 B2
(45) Date of Patent: Jul. 15, 2014

(54) METHOD AND APPARATUS FOR DEVICE PARAMETER MEASUREMENT

(75) Inventors: Tseng Chin Luo, Hsinchu (TW); Chu Fu Chen, Zhubei (TW); Min-Tar Liu, Jhubei (TW); Yuan-Yao Chang, Fengshan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 360 days.

(21) Appl. No.: 12/892,989

(22) Filed: Sep. 29, 2010

(65) Prior Publication Data
US 2012/0074981 A1  Mar. 29, 2012

(51) Int. Cl.
G01R 31/02 (2006.01)
G01R 31/3187 (2006.01)

(52) U.S. Cl.
USPC .......... 324/762.09; 324/750.3; 324/537

(58) Field of Classification Search
USPC .......... 324/762.09, 750.3
See application file for complete search history.

(56) References Cited

U.S. PATENT DOCUMENTS

| | | | |
|---|---|---|---|
| 6,268,734 B1 * | 7/2001 | Knapton | 324/537 |
| 6,873,173 B2 * | 3/2005 | Kollmer et al. | 324/750.16 |
| 7,116,113 B1 * | 10/2006 | Thompsen et al. | 324/601 |
| 7,332,924 B2 * | 2/2008 | Harris et al. | 324/750.3 |
| 7,397,235 B2 * | 7/2008 | Harjung | 324/756.04 |
| 2008/0238453 A1 * | 10/2008 | Lo et al. | 324/754 |
| 2008/0315862 A1 * | 12/2008 | Daniel | 324/73.1 |
| 2009/0034320 A1 * | 2/2009 | Ueda | 365/148 |
| 2009/0167432 A1 * | 7/2009 | van den Heuvel | 330/69 |

OTHER PUBLICATIONS

Ji, B.L. et al., "Operational Amplifier Based Test Structure for Quantifying Transistor Threshold Voltage Variation", IEEE Transactions on Semiconductor Manufacturing, Feb. 2009, 22(1):51-58.

* cited by examiner

Primary Examiner — Jermele M Hollington
Assistant Examiner — Christopher McAndrew
(74) Attorney, Agent, or Firm — Duane Morris LLP

(57) ABSTRACT

A method of measuring a parameter of a device in a circuit includes providing a device under test (DUT). The DUT includes a metal oxide semiconductor (MOS) transistor having a gate, a source, and a drain coupled to a first voltage supply node. The method further includes coupling a constant current source to the source of the transistor, coupling an operational amplifier to the transistor, and measuring a parameter of the transistor.

19 Claims, 9 Drawing Sheets

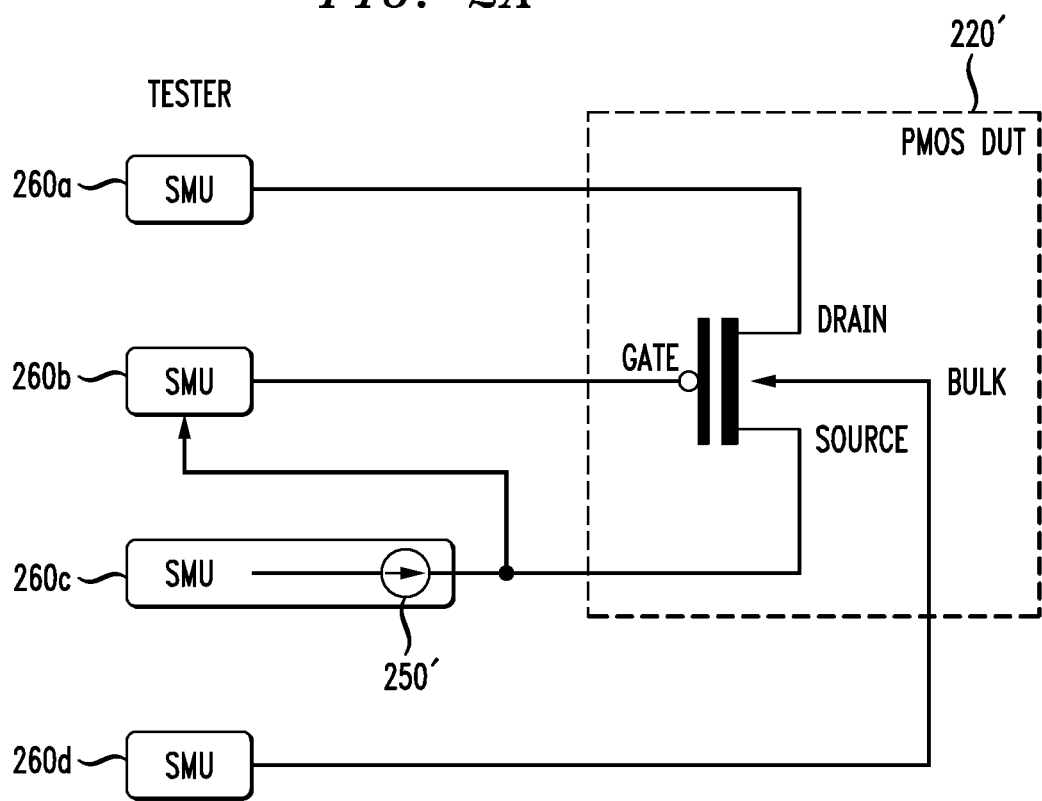

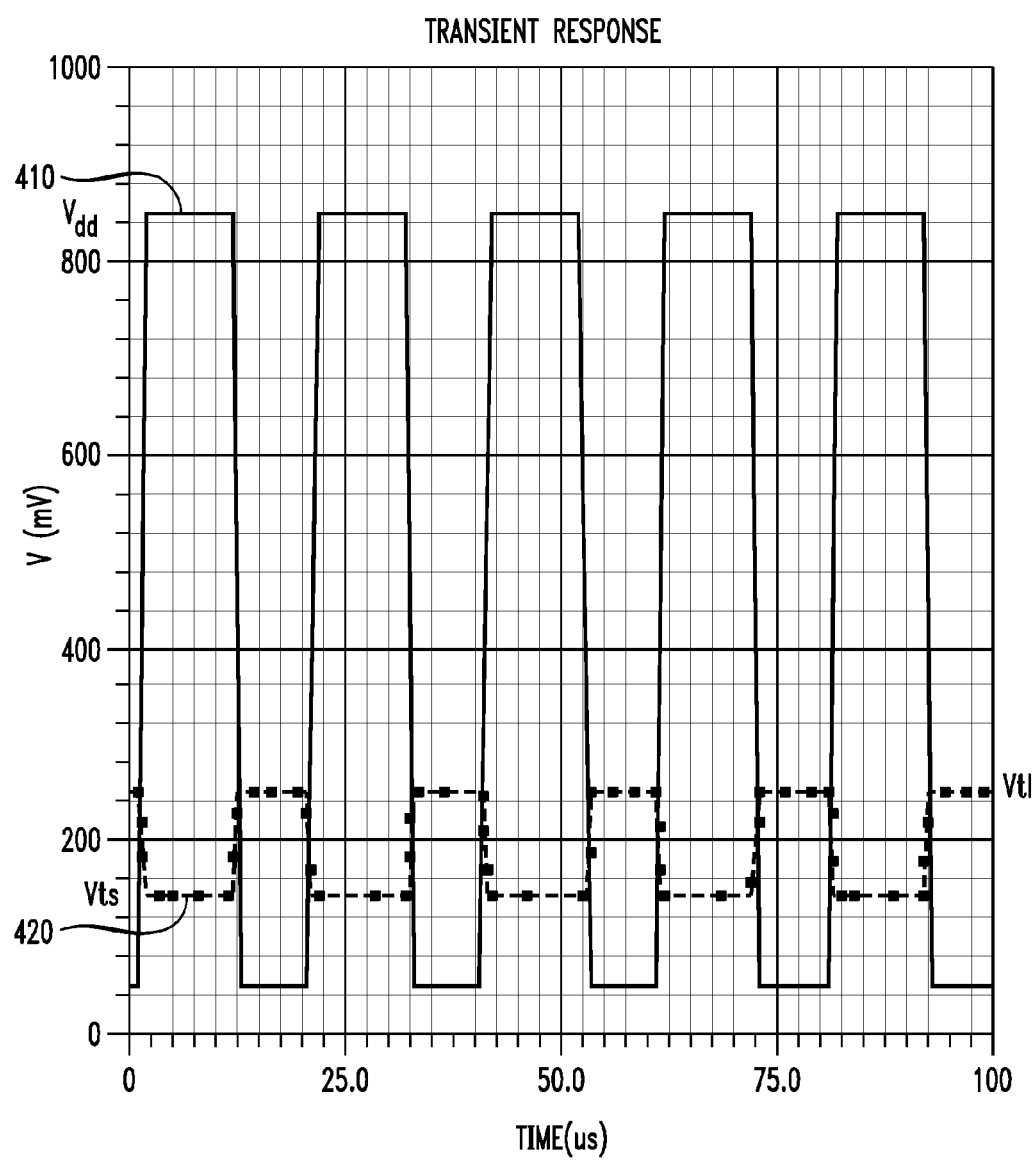

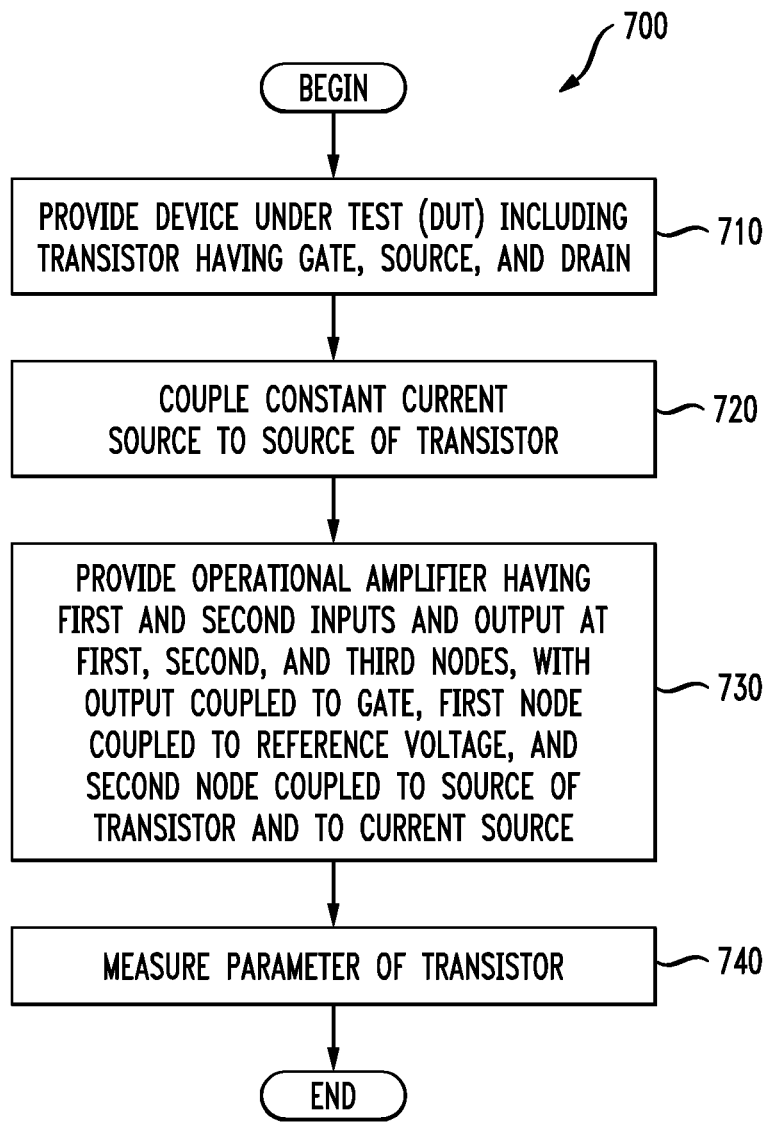

METHOD AND APPARATUS FOR DEVICE PARAMETER MEASUREMENT

FIELD

The present invention relates generally to measurement of device parameters, and more particularly to measurement of device parameters using an operational amplifier-based measurement circuits.

BACKGROUND

Wafer-level electrical testing of semiconductor products plays an important role in the semiconductor industry. Identifying defective circuit components, e.g., transistors, at the wafer level before packaging promotes cost reduction. One parameter that is tested is the threshold voltage of a metal oxide semiconductor (MOS) transistor. In the case of an NMOS transistor, the threshold voltage corresponds to the minimum voltage at a gate terminal of the transistor that allows current to flow from a source terminal to a drain terminal, i.e., the voltage at which the NMOS transistor turns on. For a PMOS transistor, the threshold voltage corresponds to the maximum gate voltage at which the transistor is turned on.

Known techniques for determining the threshold voltage of a transistor include binary search and interpolation. The binary search technique involves adjusting the gate voltage and measuring the drain current, in an iterative manner similar to a binary search for data in a sorted array. A monotone relationship, direct relationship between the gate voltage and the drain current is assumed. As an example, the gate voltage may be set (forced) to a first value, and the drain current is then measured. If the drain current exceeds a predetermined threshold current, the gate voltage is reduced to a second value and the drain current is measured again. If the drain current is now less than the threshold current, the drain current is then increased, and the search continues in this manner until a terminating condition is met, e.g., until the drain current is within a predetermined distance from the predetermined threshold current. The binary search technique is relatively slow, requiring several force/measure cycles.

The interpolation technique also exploits the monotone, direct relationship between the gate voltage and the drain current. Suppose two force/measure cycles are performed to obtain two data points $(V_{G1}, I_{D1})$ and $(V_{G2}, I_{D2})$, where $V_G$ stands for gate voltage, $I_D$ stands for drain current, $I_{D1}$ is greater than the threshold current, and $I_{D2}$ is less than the threshold current. Interpolation (e.g., linear interpolation, if linearity is assumed) is then performed to determine a gate voltage that approximately corresponds to the threshold current.

BRIEF DESCRIPTION OF THE DRAWINGS

The accompanying drawings illustrate preferred embodiments of the invention, as well as other information pertinent to the disclosure, in which:

FIG. 2A illustrates a similar embodiment utilizing a PMOS DUT.

FIG. 4 is a transient response plot showing various measured circuit parameters in accordance with various embodiments of the present invention.

FIG. 7 is a flow diagram in accordance with an embodiment of the present invention.

DETAILED DESCRIPTION

Figure 1A:
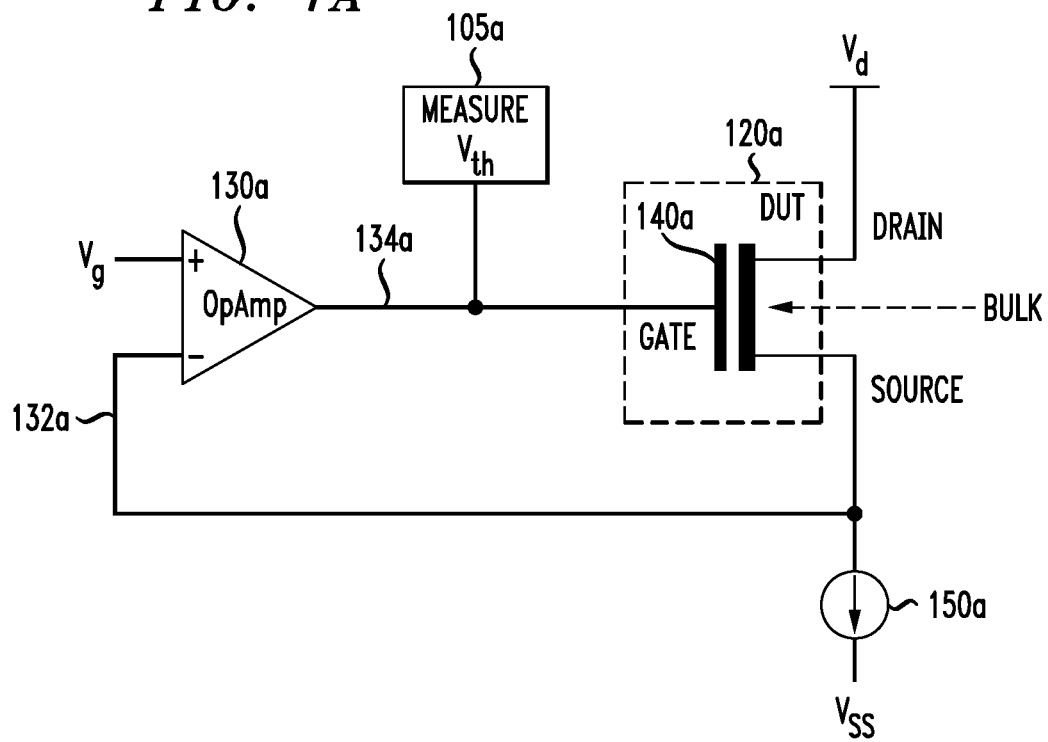
FIGS. 1A-B are schematic diagrams in accordance with various embodiments of the present invention, in which a test circuit including an operational amplifier is implemented on the same chip as a device under test (DUT) that is an NMOS (FIG. 1A) or PMOS (FIG. 1B) device.
Figure 1B:
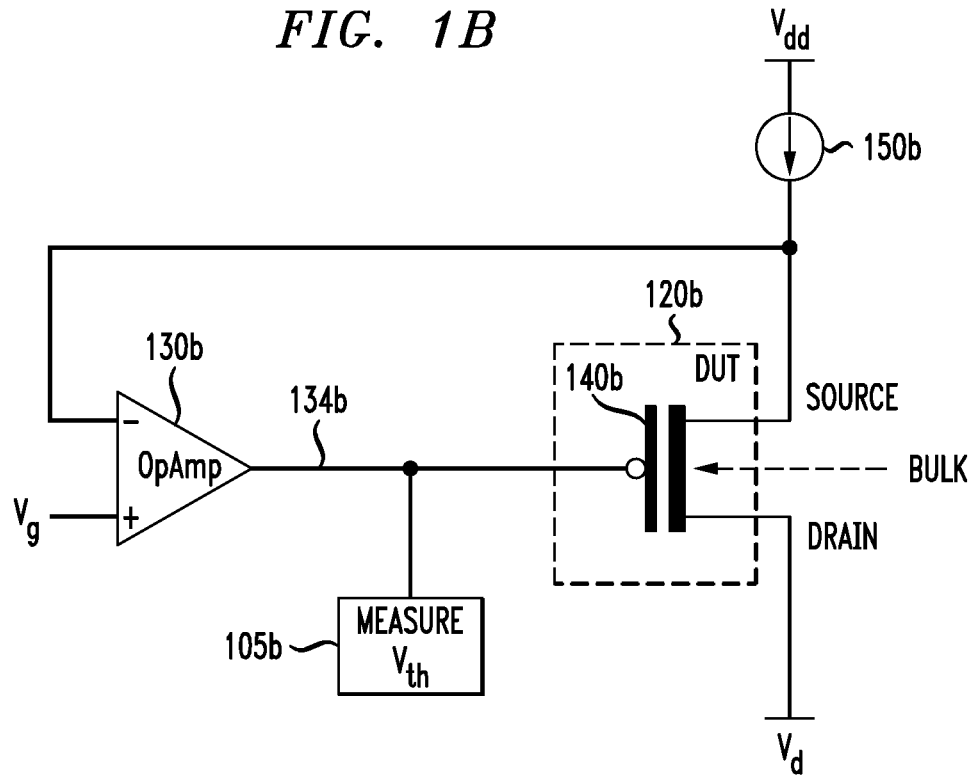

FIGS. 1A-B are schematic diagrams in accordance with various embodiments of the present invention, in which a test circuit including an operational amplifier is implemented on the same chip as a device under test (DUT) that includes an NMOS (FIG. 1A) or PMOS (FIG. 1B) transistor device. Referring to FIG. 1A, an operational amplifier (op-amp) 130a has a first input that may be a non-inverting input (+) provided at a first node denoted $V_g$, a second input that may be an inverting input (−) provided at a second node 132a, and an output provided at a third node 134a. A device under test 120a includes an NMOS transistor 140a having a gate terminal (gate) coupled to the output of the operational amplifier 130a at node 134a, a source terminal (source) coupled to the second node 132a, a drain terminal (drain), and a bulk terminal. A constant current source 150a is coupled to the second node 132a and to a voltage supply node $V_{ss}$. The drain is coupled to another voltage supply node $V_d$, which is described further below.

The constant current source 150a provides a constant current equal to a predetermined threshold current value for the DUT, which is a product of a predetermined current and a width-to-length (W/L) ratio of the transistor 140a. The predetermined current that multiplies the W/L ratio in this expression may depend upon a fabrication process technology that is employed and may have a value of 10 nA, for example. It should be understood that current values other than 10 nA may be selected for the predetermined threshold current. Thus, the threshold current may be −10 nA*W/L. The voltage of the first node $V_g$ is set (forced) to 0 V, and the voltage at the third node 134a is automatically adjusted by the operational amplifier feedback to maintain the threshold current. In other words, the voltage at the third node 134a may be measured directly by a measurement device (e.g., voltmeter) 105a to determine the threshold voltage of the transistor 140a. The voltage at node $V_g$ can be set to 0 V once to enable the threshold voltage measurement, unlike conventional techniques in which input voltages must be swept across a range of values in order to narrow in on the threshold voltage. The operational amplifier 130a, current source 150a, and measurement device 105a may be considered to be part of a test circuit that tests the DUT 120a.

The drain voltage at node $V_d$ may be set to different voltages to enable measurement of different circuit parameters. The voltage at node $V_d$ may be set to a power supply voltage $V_{dd}$, in which case the measured threshold voltage is a threshold voltage in a saturation mode (saturation operating region) of the transistor 140a. Alternatively, the voltage at node $V_d$ may be set to a substantially small voltage close to, but above, ground level, such as less than or equal to about 0.1V (e.g., 0.05 V), to drive the drain terminal. In this case the measured threshold voltage is a threshold voltage in a linear mode (linear operating region) of the transistor.

FIG. 1B shows a similar test configuration for a PMOS device instead of an NMOS device as in FIG. 1A. In FIG. 1B, a device under test (DUT) 120b includes a PMOS transistor 140b that has a source that provides feedback to an input, e.g., an inverting input terminal, of an operational amplifier 130b. The operational amplifier 130b has another input, e.g., a non-inverting input, at a node $V_g$. An output of the operational amplifier 130b is provided at a node 134b to which a gate of the PMOS transistor 140b is coupled. A drain of the transistor 140b is coupled to a voltage supply node $V_d$. A constant current source 150b is coupled to a source of the transistor 140b and to a power supply node $V_{ss}$. As in FIG. 1A, the constant current source 150b provides a constant current that is a threshold current. The voltage at node $V_g$ is set (forced) to 0 V, and the voltage at node 134b is automatically adjusted by the operational amplifier feedback to maintain the threshold current, thereby enabling the output 134b of the operational amplifier to be measured directly by a measurement device 105b to obtain the threshold voltage. The operational amplifier 130b, current source 150b, and measurement device 105b may be considered to be part of a test circuit that tests the DUT 120b.

Figure 2:
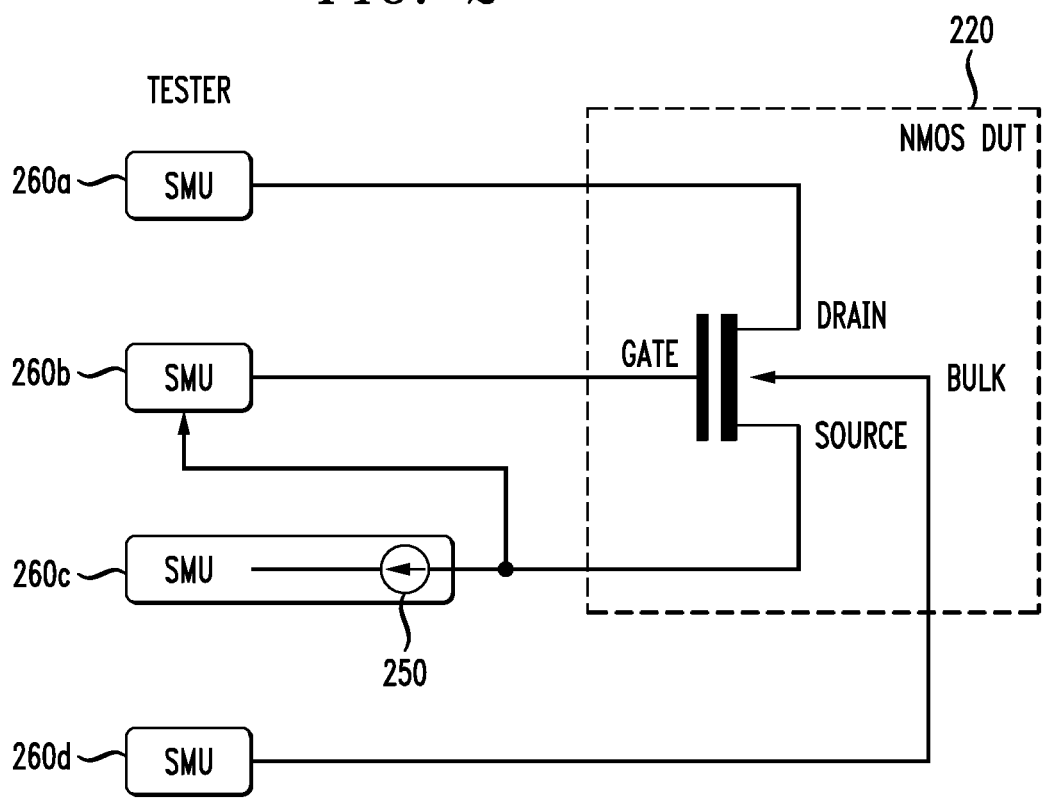
FIG. 2 is a schematic diagram in accordance with various embodiments of the present invention, in which a NMOS DUT is configured in a stand-alone configuration separate from test circuitry.

FIG. 2 is a schematic diagram in accordance with various embodiments of the present invention, in which a device under test (DUT) 220, including NMOS transistor 140a, is configured in a stand-alone configuration separate from test circuitry. A source measurement unit (SMU) 260b is coupled to a gate of the transistor 140a. SMU 260b includes an operational amplifier, e.g., operational amplifier 130a (not shown in FIG. 2). A SMU may be a card that is configured to be inserted into a tester in accordance with a stand-alone DUT embodiment. In some embodiments, a separate SMU 260c provides a constant current source 250 to the source of the transistor 140a. Providing separate SMUs 260b, 260c for the gate and source as opposed to having a single SMU for both increases configuration flexibility in a stand-alone DUT embodiment. SMU 260b is configured to force a voltage (e.g., a reference voltage input to an operational amplifier, or Vg) to zero once, and SMU 260c is configured to force a current (the constant current) to −10 nA*W/L. The operational amplifier feedback automatically adjusts the voltage at the output of the SMU to maintain a threshold current. A measurement device (not shown), which may be a component of the SMU 260b, or separate therefrom, and which may include a digital voltmeter, may measure the gate voltage to obtain the threshold voltage. Thus, a single force/measure cycle is executed.

Similar to the discussion above regarding FIG. 1A, a SMU 260a may force a voltage at a drain of the transistor 140a to a power supply voltage $V_{dd}$ or to a substantially small voltage (e.g., 0.05 V) to enable measurement of a threshold voltage in the saturation or linear modes, respectively, of the transistor. A SMU 260d may force a voltage at a bulk terminal of the transistor 140a to 0 V so that the measured threshold voltage is not affected by the bulk (body) terminal. SMUs 260a, 260b, 260c, 260d may all be part of a single SMU or may be separate SMUs.

Figure 3:
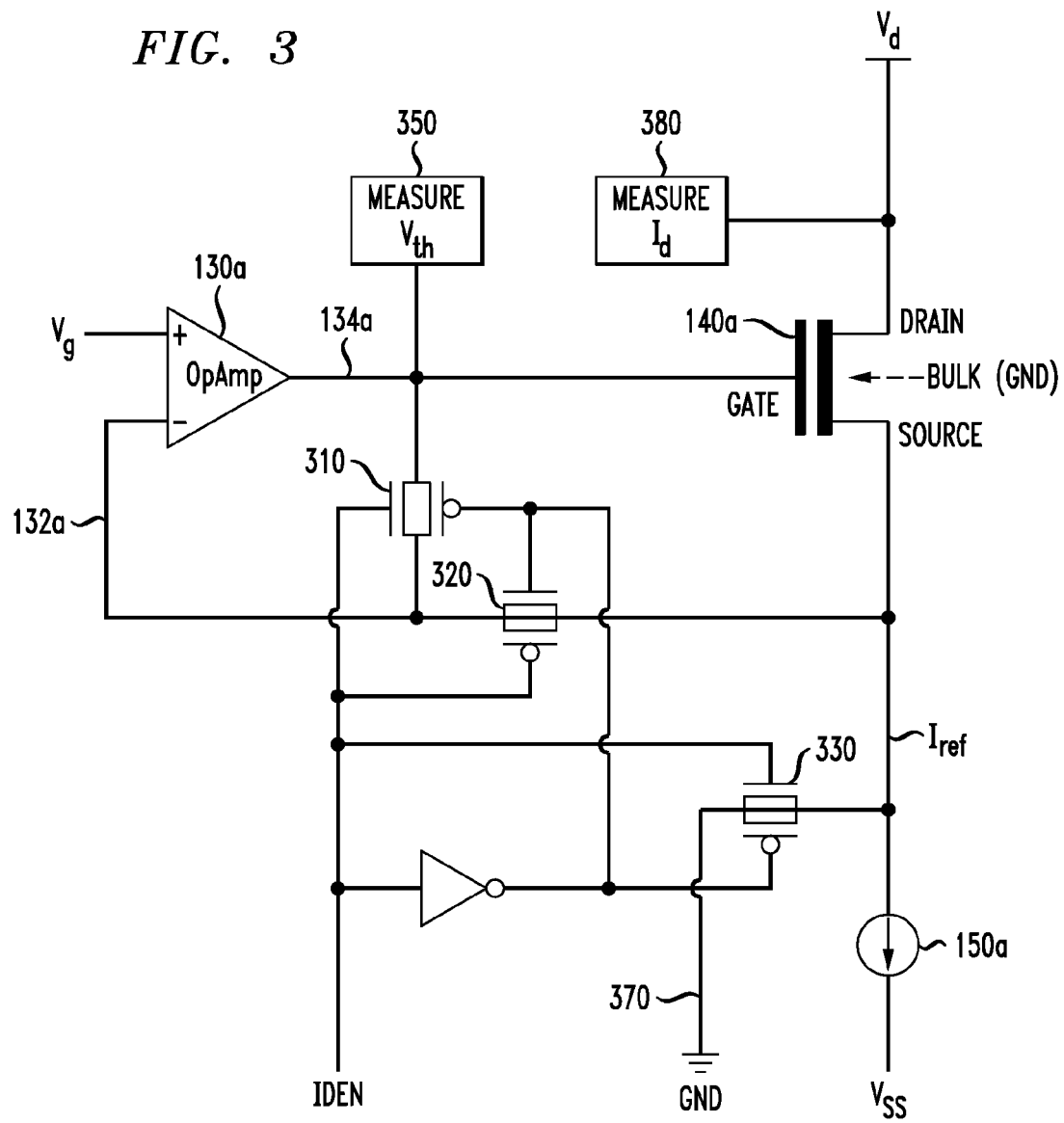
FIGS. 3 and 3A is a schematic diagram in accordance with various embodiments of the present invention, in which switching circuitry enables various circuit parameters to be tested for NMOS and PMOS DUTS, respectively.

FIG. 3 is a schematic diagram in accordance with various embodiments of the present invention, in which switching circuitry enables various different device parameters to be tested. Several circuit elements in FIG. 3 do not require further discussion based on the discussion regarding FIG. 1A; only differences between the figures are discussed below. In FIG. 3, a control signal IDEN controls several switches. A first switch 310 is configured to selectively couple the output 134a of the operational amplifier 130 to the input node 132a. A second switch 320 is configured to selectively couple the input node 132 to the source of the transistor 140a. A third switch 330 is configured to selectively couple the source of transistor 140a to a voltage supply node 370 (labeled GND) that may be an electrical ground. The switches 310, 320, 330 may be implemented as transmission gates, with the control signal IDEN provided to NMOS inputs of respective transmission gates 310, 330 and to a PMOS input of transmission gate 320. The signal IDEN is inverted at an inverter 340 and then passed to PMOS inputs of respective transmission gates 310, 330 and to an NMOS input of transmission gate 320. In this manner, IDEN controls the switches, with switches 310 and 330 closed and switch 320 opened when IDEN is high (e.g., logic '1'), and switches 310 and 330 opened and switch 320 closed when IDEN is low (e.g., logic '0'). The logic convention may be reversed, and the switches may be implemented in other ways familiar to one of ordinary skill in the art.

When IDEN is low, the circuit in FIG. 3 is in the configuration of FIG. 1A. The voltage at node $V_g$ is forced to 0 V, and the constant current source 150a provides a threshold current. Then, depending on whether the drain voltage $V_d$ is set to a power supply voltage $V_{dd}$ or a substantially small voltage (e.g., 0.05 V), the threshold voltage measured by the voltmeter 350 corresponds to the threshold voltage of either the saturation mode or the linear mode of the transistor 140a, as discussed above.

When IDEN is high, the source of the transistor 140a is coupled to node 370, which may be ground, resulting in zero source current. Feedback in this configuration is between the output node 134 and input node 132 rather than between the source of the transistor 140a and the input node 132. The voltage at node $V_g$ may be set to a power supply voltage $V_{dd}$. Then, if the drain voltage at node $V_d$ is set to $V_{dd}$, an ammeter 380 measures a drain current in the saturation mode of the transistor 140a. Ammeter 380 may be part of a SMU. If the voltage at node $V_d$ is instead set to a substantially small voltage such as 0.05 V, the measured drain current is in the linear mode. Alternatively, if voltage at node $V_g$ is set to zero, setting the voltage at node $V_d$ to $V_{dd}$ enables measurement of a drain current in the cutoff mode of the transistor. Thus, varying three parameters (IDEN, the voltage at node $V_g$, and the voltage at node $V_d$) enables measurement of a variety of circuit parameters as summarized in Table 1. In Table 1, $V_{ts}$, $V_{tl}$, $I_{Dsat}$, $I_{Doff}$, and $I_{Dlin}$ refer to saturation threshold voltage, linear threshold voltage, saturation drain current, cutoff drain current, and linear drain current, respectively. $I_{ref}$ refers to a reference current provided to the source of the transistor 140a that is either 10 nA*W/L or 0 depending on IDEN.

TABLE 1

Test Parameters for NMOS DUT

| IDEN | $V_g$ | $V_d$ | $I_{ref}$ | Measured Parameter |
|---|---|---|---|---|
| low | 0 | $V_{dd}$ | 10 nA * W/L | $V_{ts}$ |
| low | 0 | 0.05 V | 10 nA * W/L | $V_{tl}$ |
| high | $V_{dd}$ | $V_{dd}$ | 0 | $I_{Don}$ |
| high | 0 | $V_{dd}$ | 0 | $I_{Doff}$ |
| high | $V_{dd}$ | 0.05 V | 0 | $I_{Dlin}$ |

Figure 3A:
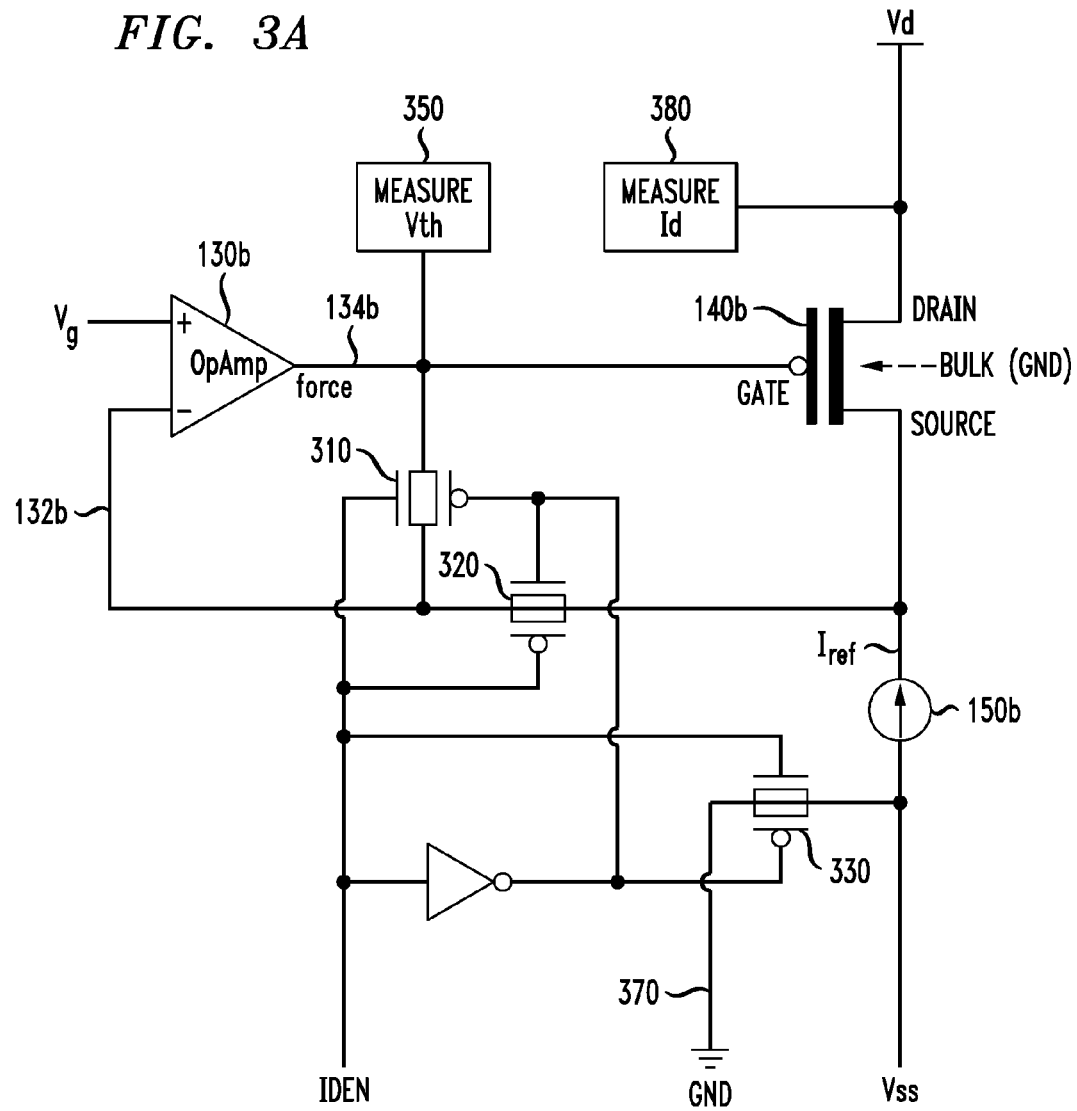

Although FIGS. 2-3 show NMOS transistors, PMOS transistors may be used in other embodiments. FIG. 2A illustrates a PMOS DUT in a stand-alone configuration separate from test circuitry. FIG. 2A is identical in all respects to FIG. 2, and like components are labeled with like reference numbers, only the device under test is a PMOS transistor and labeled as 220' and current source (labeled 250') is oriented in an opposite direction when compared to current source 250. FIG. 3A is identical to FIG. 3 only components and nodes (other than the switches 310, 320, 330 and measuring devices 350 and 380) are labeled with reference "b" rather than reference "a". The DUT is a PMOS transistor labeled 140b and the constant current source is labeled 150b. Table 2 shows the parameters (IDEN, the voltage at node $V_g$, and the voltage at node $V_d$) that can be varied to enable measurement of a variety of circuit parameters in the PMOS transistor DUT embodiment.

TABLE 2

Test Parameters for PMOS DUT

| IDEN | $V_g$ | $V_d$ | $I_{ref}$ | Measured Parameter |
|---|---|---|---|---|
| low | 0 | $-V_{dd}$ | $-10$ nA * W/L | $V_{ts}$ |
| low | 0 | $-0.05$ V | $-10$ nA * W/L | $V_{tl}$ |
| high | $-V_{dd}$ | $-V_{dd}$ | 0 | $I_{Don}$ |
| high | 0 | $-V_{dd}$ | 0 | $I_{Doff}$ |
| high | $-V_{dd}$ | $-0.05$ V | 0 | $I_{Dlin}$ |

FIG. 4 is a transient response plot showing various measured circuit parameters in accordance with various embodiments of the present invention. FIG. 4 shows a forced voltage 410, which may be drain voltage Vd as in FIG. 1A, and a sensed voltage 420, which may the threshold voltage at node 134a as in FIG. 1A. The forced voltage 410 and the sensed voltage 420 may be regarded as an independent variable/ dependent variable pair. When the forced voltage 410 is set to power supply voltage Vdd, the sensed voltage corresponds to a threshold voltage in the saturation region of the transistor 140a, as denoted by $V_{ts}$ in FIG. 4. When the forced voltage 410 is set to a substantially small voltage such as 0.05 V, the sensed voltage corresponds to a threshold voltage in the linear region, as denoted by $V_{tl}$.

Figure 5:
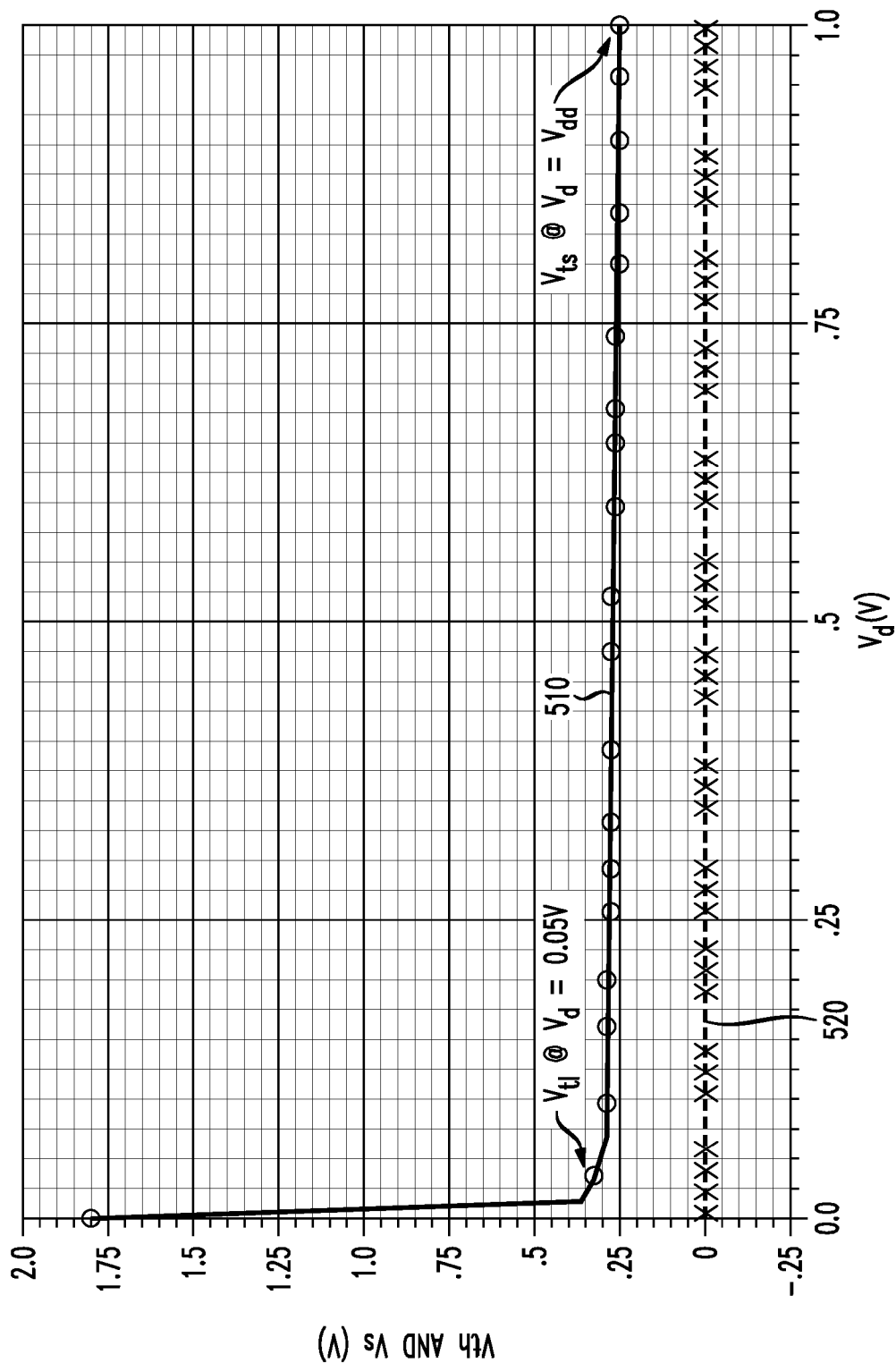
FIG. 5 is a plot of threshold voltage and source voltage as a function of drain voltage in accordance with various embodiments of the present invention.

FIG. 5 is a plot of threshold voltage 510 (denoted $V_{th}$) and source terminal voltage 520 (denoted $V_s$) as a function of drain voltage (denoted $V_d$) in accordance with various embodiments of the present invention. When the drain voltage $V_d$ is set to a substantially small value, e.g., 0.05 V, the threshold voltage corresponds to the linear transistor mode. When $V_d$ is set to a power supply voltage $V_{dd}$ (e.g., 1 V), the threshold voltage corresponds to the saturation mode.

Figure 6:
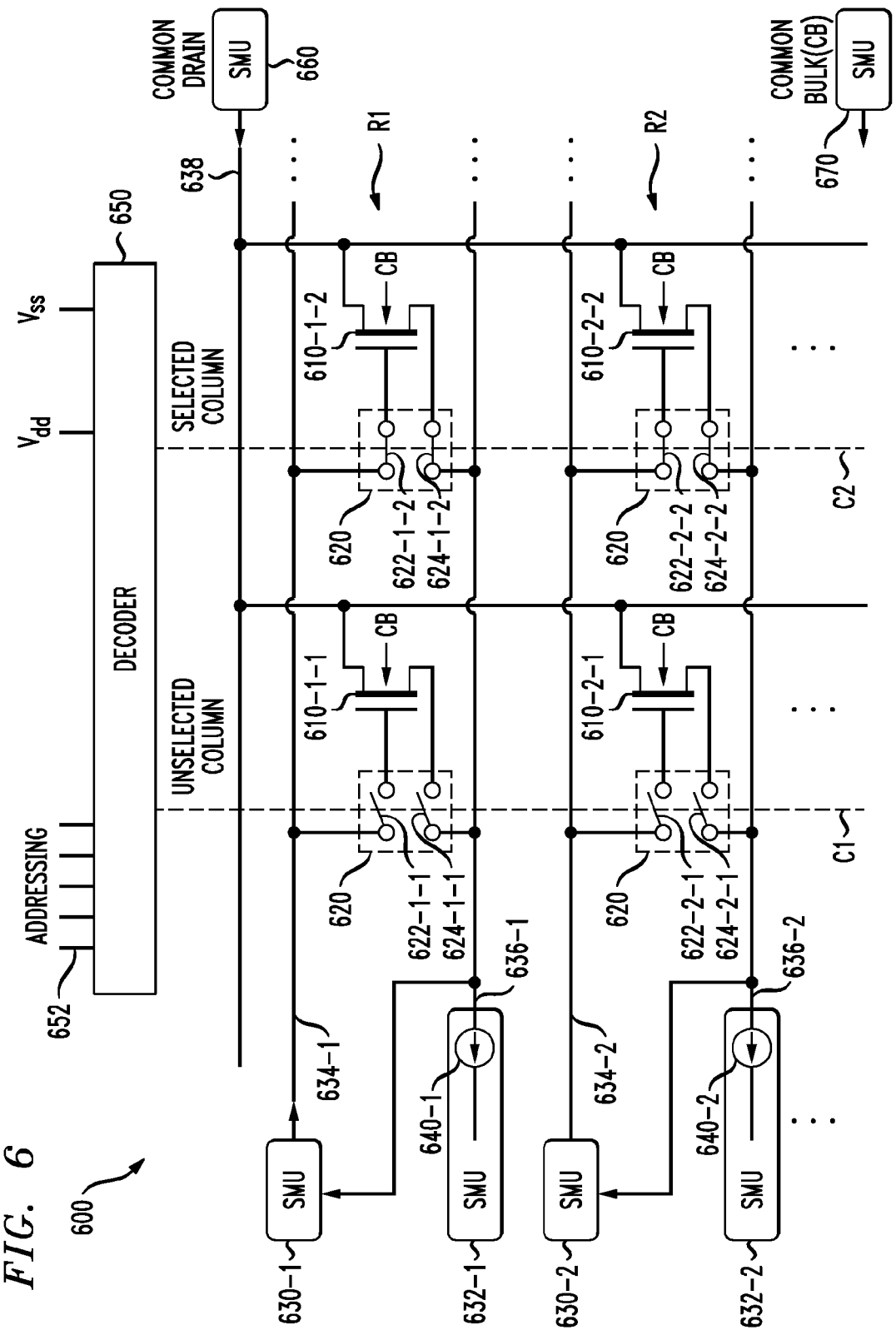
FIG. 6 is a plot of an array test structure in accordance with various embodiments of the present invention.

FIG. 6 is a schematic diagram of an array test structure 600 in accordance with various embodiments of the present invention. The array test structure 600 enables parallel testing of transistors, with each individual transistor tested in a manner similar to the testing shown in FIG. 2. Multiple transistors are arranged in an array of rows and columns, with each transistor denoted 610-i-j, where "i" is a row index and "j" is a column index. For example, FIG. 6 shows transistors 610-1-1, 610-1-2, 610-2-1, and 610-2-2 (collectively 610) in two rows R1, R2 and two columns C1, C2, although other numbers of rows and columns may be used. A first group of source measurement units (SMUs) 630-1, 630-2, . . . (collectively 630) and a second group of SMUs 632-1, 632-2, . . . (collectively 632) are provided, with one SMU from each group corresponding to a row. Each SMU 630 in the first group includes an operational amplifier (not shown in FIG. 6 for visual simplicity) having first and second inputs and an output. The second input of each operational amplifier is configured to receive feedback much like in FIG. 2 and is shown as a feedback input into each SMU 630 in FIG. 6. The outputs of respective SMUs 630 are provided at respective lines (nodes) 634-1, 634-2, . . . (collectively 634). Each SMU 630 is configured to force a zero voltage once at the first input to the corresponding operational amplifier and to measure a threshold voltage at the SMU output.

The SMUs 632 in the second group include respective constant current sources 640-1, 640-2, . . . (collectively 640) providing constant currents each equal to a threshold current, e.g., $-10$ nA*W/L, where W/L is a width-to-length ratio of the transistors 610. The constant currents are provided at respective lines 640-1, 640-2, . . . (collectively 640).

A SMU 670 provides a common bulk input to all the transistors 610. A SMU 660 provides a common drain voltage to the drain inputs of all the transistors 610 via a node 638. A switching module 620 includes a pair of switches for each transistor 610. For example, a switch 622-1-1 is configured to selectively couple a gate of transistor 622-1-1 to node 634-1 at the output of the SMU 630-1. Another switch 624-1-1 is configured to selectively couple a source of transistor 622-1-1 to the second input of SMU 630-1 to provide feedback as shown in FIG. 6.

A decoder 650 is configured to select one of the columns. The decoder is a decoder known to one of ordinary skill in the art, with voltage supply inputs $V_{dd}$ and $V_{ss}$ and address inputs 652. The decoder 638 causes switches in the switching module 620 corresponding to the selected column to close. The switches in the other (unselected) columns are opened, so only the transistors in the selected column are in feedback configurations similar to FIG. 2. Each transistor in the selected column is tested in parallel. Setting the common drain to a power supply voltage Vdd via SMU 660 enables a measurement of a saturation threshold voltage at a gate of each transistor in the selected column. Alternatively, setting the common drain to a substantially small voltage, e.g., 0.05 V, enables a measurement of a linear threshold voltage at a gate of each transistor in the selected column. Although NMOS transistors are shown in FIG. 6, PMOS transistors may be tested in an array test setup as well, using a configuration similar to FIG. 1B. This PMOS architecture is identical to the NMOS architecture of FIG. 6 only with the modifications discussed above in connection with FIG. 1B, FIG. 2A and FIG. 3A.

FIG. 7 is a flow diagram in accordance with an embodiment of the present invention. After process 700 begins, a device under test (DUT) is provided (710). The DUT includes a metal oxide semiconductor (MOS) transistor having a gate, a source, and a drain coupled to a first voltage supply node. A constant current source is coupled (720) to the source of the transistor. An operational amplifier is provided (730); the operational amplifier has a first input at a first node, a second input at a second node, and an output at a third node. The output of the operational amplifier is coupled to the gate of the transistor, the first node is coupled to a reference voltage, and the second node is coupled to the source of the transistor and to the constant current source. A parameter of the transistor is measured (740). Although the steps of process 700 are shown occurring in a particular order in FIG. 7, that order is merely a non-limiting example, and the steps may occur in other orders as well.

Various embodiments may be implemented in a parametric tester such as a series 4070 tester manufactured by Agilent Technologies, 5301 Stevens Creek Blvd, Santa Clara Calif. Fast, flexible testing of various circuit parameters is provided, without the need for separate testers for different circuit measurements. Thus, embodiments promote efficient wafer production and reduced manufacturing cost.

In some embodiments, a device parameter test circuit has an operational amplifier, a constant current source, and first, second, and third switches. The operational amplifier has a first input at a first node, a second input at a second node, and an output at a third node. The first node is coupled to a reference voltage. The first switch is configured to selectively couple the second node to the third node. The second switch is configured to selectively couple the second node to a fourth node. The constant current source is coupled to the fourth node. The third switch is configured to selectively couple the fourth node to a first voltage supply node. The device parameter test circuit is configured through selective triggering of the switches to measure a selected parameter from a plurality of parameters of a device coupled to the device parameter test circuit.

In some embodiments, a method includes providing a device under test (DUT) including a metal oxide semiconductor (MOS) transistor having a gate, a source, and a drain coupled to a first voltage supply node. The method further includes coupling a constant current source to the source of the transistor, coupling an operational amplifier to the transistor, and measuring a parameter of the transistor.

In some embodiments, a circuit includes an operational amplifier, a constant current source, and a metal oxide semiconductor (MOS) transistor. The operational amplifier has a first input at a first node, a second input at a second node, and an output at a third node. The first node is coupled to a reference voltage. The constant current source is coupled to the second node and to a first voltage supply node. The transistor has a gate coupled to the third node, a source coupled to the second node, and a drain coupled to a second voltage supply node.

In some embodiments, a circuit test system includes multiple transistors arranged in rows and columns, first and second pluralities of source measurement units (SMUs), a decoder, and a switching module. Each SMU in the first plurality of SMUs corresponds to one of the rows and includes an operational amplifier having a first input, a second input, and an output provided at a corresponding one of a first plurality of lines, and each such SMU is configured to measure a voltage of the corresponding line in the first plurality of lines. Each SMU in the second plurality of SMUs corresponds to one of the rows and is configured to provide a constant current source to a corresponding one of a second plurality of lines. The decoder is configured to select one of the columns. The switching module is configured to couple a gate of each transistor in the selected column to a corresponding line in the first plurality of lines and is further configured to couple a source of each transistor in the selected column to a corresponding line in the second plurality of lines. The source of each transistor in the selected column is coupled by the switching module to the second input of the operational amplifier in a corresponding SMU in the first plurality of SMUs.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A device parameter test circuit comprising:
an operational amplifier having a first differential input at a first node, a second differential input at a second node, and an output at a third node, the first node being coupled to a reference voltage;
a first switch external to the operational amplifier configured to selectively couple the second node to the third node to feedback the output of the operational amplifier directly to the second differential input of the operation amplifier;
a second switch configured to selectively couple the second node to a fourth node;
a constant current source coupled to the fourth node; and
a third switch configured to selectively couple the fourth node to a first voltage supply node;
wherein the device parameter test circuit is configured through selective triggering of the switches to measure a selected parameter from a plurality of parameters of a device coupled to the device parameter test circuit, and
wherein the third node is different than the fourth node and corresponds to a first terminal of the device and the fourth node corresponds to a second terminal of the device.

2. The circuit of claim 1, further comprising the device coupled to the device parameter test circuit, wherein the device is a metal oxide semiconductor (MOS) transistor having a gate coupled to the third node, a source coupled to the fourth node, and a drain coupled to a second voltage supply node.

3. The circuit of claim 2, wherein the constant current source is configured to provide a constant current that is a product of a predetermined current and a width-to-length ratio of the transistor.

4. The circuit of claim 1, wherein the first, second, and third switches are controlled by a control signal, wherein the first and third switches are configured to be closed responsive to a first value of the control signal, and wherein the second switch is configured to be closed responsive to a second value of the control signal opposite the first value.

5. A method of measuring a parameter of a device in a circuit, the method comprising:
providing a device under test (DUT), the DUT being a metal oxide semiconductor (MOS) transistor having a gate, a source, and a drain coupled to a first voltage supply node;
coupling a constant current source to the source of the transistor;
coupling an operational amplifier to the transistor; and
measuring a parameter of the transistor,
wherein the operational amplifier has a first differential input at a first node, a second differential input at a second node, and an output at a third node, the output being coupled to the gate of the transistor, the first node being coupled to a reference voltage.

6. The method of claim 5, further comprising:
providing a first switch external to the operational amplifier configured to selectively couple the second node to the third node to feedback the output of the operational amplifier directly to the second differential input of the operational amplifier;
providing a second switch configured to selectively couple the second input of the operational amplifier to the source of the transistor;
providing a third switch configured to selectively couple the source of the transistor to a second voltage supply node;

controlling the switches to close either the first and third switches or the second switch; and setting the reference voltage and the first voltage supply node to first and second control voltages, respectively;

wherein measuring the parameter of the transistor comprises measuring the parameter at the gate or the drain of the transistor.

7. The method of claim 6, wherein the transistor is an NMOS transistor and controlling the switches includes closing the second switch, and wherein the measured parameter is a threshold voltage of the transistor.

8. The method of claim 7, wherein the first control voltage is about zero, the second control voltage is a power supply voltage, and the threshold voltage is measured in a saturation mode of the transistor.

9. The method of claim 7, wherein the first control voltage is about zero, the second control voltage is a substantially small voltage, and the threshold voltage is measured in a linear mode of the transistor.

10. The method of claim 6, wherein the transistor is an NMOS transistor and controlling the switches comprises closing the first and third switches, and wherein the measured parameter is a drain current of the transistor.

11. The method of claim 10, wherein the first control voltage is a power supply voltage, the second control voltage is the power supply voltage, and the drain current is measured in a saturation mode of the transistor.

12. The method of claim 10, wherein the first control voltage is about zero, the second control voltage is a power supply voltage, and the drain current is measured in a cutoff mode of the transistor.

13. The method of claim 10, wherein the first control voltage is a power supply voltage, the second control voltage is a substantially small voltage, and the drain current is measured in a linear mode of the transistor.

14. A circuit comprising:
an operational amplifier having a first differential input at a first node, a second differential input at a second node, and an output at a third node, the first node being coupled to a reference voltage;
a constant current source coupled to the second node and to a first voltage supply node; and
a device under test (DUT), the DUT being a metal oxide semiconductor (MOS) transistor having a gate coupled to the third node, a source coupled to the second node, and a drain coupled to a second voltage supply node,
wherein the operational amplifier is provided by a first source measurement unit (SMU) comprising the operational amplifier and a measurement device configured to measure the voltage of the third node, and wherein the constant current source is provided by a second SMU.

15. The circuit of claim 14, further comprising a third SMU configured to set the second voltage supply node to a power supply voltage, and wherein the measured output of the operational amplifier is a threshold voltage of the transistor in a saturation mode.

16. The circuit of claim 14, further comprising a third SMU configured to set the second voltage supply node to a substantially small voltage, and wherein the measured output of the operational amplifier is a threshold voltage of the transistor in a linear mode.

17. A circuit test system comprising:
a plurality of transistors arranged in rows and columns,
a first plurality of source measurement units (SMUs), each SMU in the first plurality of SMUs corresponding to one of the rows and comprising an operational amplifier having a first input, a second input, and an output provided at a corresponding one of a first plurality of lines, that SMU configured to measure a voltage of the corresponding said one line in the first plurality;
a second plurality of SMUs, each SMU in the second plurality of SMUs corresponding to one of the rows and configured to provide a constant current source to a corresponding one of a second plurality of lines;
a decoder configured to select one of the columns; and
a switching module configured to:
couple a gate of each transistor in the selected column to a corresponding line in the first plurality of lines, and
couple a source of each transistor in the selected column to a corresponding line in the second plurality of lines;
wherein the source of each transistor in the selected column is coupled by the switching module to the second input of the operational amplifier in a corresponding SMU in the first plurality of SMUs.

18. The system of claim 17, wherein the transistors are NMOS transistors and a drain of each transistor in the selected column is coupled to a power supply voltage, and each SMU in the first plurality of SMUs is configured to measure a threshold voltage in a saturation mode of a corresponding transistor in the selected column.

19. The system of claim 17, wherein the transistors are NMOS transistors and a drain of each transistor in the selected column is coupled to a common drain voltage that is a substantially small voltage, and each SMU in the first plurality of SMUs is configured to measure a threshold voltage in a linear mode of a corresponding transistor in the selected column.

* * * * *